United States Patent [19]

Mahulikar

[11] Patent Number: 5,103,292

[45] Date of Patent: Apr. 7, 1992

[54] METAL PIN GRID ARRAY PACKAGE

[75] Inventor: Deepak Mahulikar, Meriden, Conn.

[73] Assignee: Olin Corporation, New Haven, Conn.

[21] Appl. No.: 442,877

[22] Filed: Nov. 29, 1989

[51] Int. Cl.⁵ .................... H01L 23/50; H01L 23/34
[52] U.S. Cl. ........................................ 357/74; 357/72
[58] Field of Search ............................. 357/74, 72, 81

[56] References Cited

U.S. PATENT DOCUMENTS

| | | | |
|---|---|---|---|
| 3,676,292 | 10/1970 | Pryor et al. | 357/74 |
| 4,322,778 | 3/1982 | Barbour et al. | 357/74 |
| 4,338,621 | 7/1982 | Braun | 357/74 |
| 4,461,924 | 7/1984 | Butt | 174/52 FP |
| 4,480,262 | 10/1984 | Butt | 357/74 |
| 4,561,006 | 12/1985 | Currie | 357/74 |
| 4,607,276 | 8/1986 | Butt | 257/79 |
| 4,630,096 | 12/1986 | Drye et al. | 357/74 |
| 4,688,152 | 8/1987 | Chia | 361/408 |
| 4,707,382 | 11/1987 | Suppinger et al. | 29/879 |
| 4,716,082 | 12/1987 | Ahearn et al. | 428/428 |
| 4,721,993 | 1/1988 | Walter | 357/70 |
| 4,736,236 | 4/1988 | Butt | 357/70 |
| 4,806,409 | 2/1989 | Walter et al. | 428/138 |
| 4,816,426 | 3/1989 | Bridges et al. | 437/207 |
| 4,821,151 | 4/1989 | Pryor et al. | 361/403 |
| 4,823,234 | 4/1989 | Konishi et al. | 357/72 |
| 4,827,376 | 5/1989 | Voss | 361/388 |
| 4,849,857 | 7/1989 | Butt et al. | 361/388 |
| 4,887,148 | 12/1989 | Mu | 357/74 |
| 4,901,136 | 2/1990 | Neugebauer et al. | 357/74 |
| 4,935,581 | 6/1990 | Komathu | 174/52.4 |

FOREIGN PATENT DOCUMENTS

| | | |
|---|---|---|
| 89103083 | 10/1989 | European Pat. Off. . |
| 891065682 | 10/1989 | . |
| 61-8959 | 11/1986 | Japan . |
| 62-274753 | 11/1987 | Japan . |
| 63-65657 | 3/1988 | Japan .................... 357/74 |
| 63-126256 | 5/1988 | Japan .................... 357/74 |

OTHER PUBLICATIONS

Toshiba CMOS ASIC's New Product Release: Metal Pin-Grid Array Package; Mar. 1988; Version 1.

Primary Examiner—Andrew J. James
Assistant Examiner—Viet Q. Nguyen
Attorney, Agent, or Firm—Gregory S. Rosenblatt; Paul Weinstein

[57] ABSTRACT

A metal pin grid array package and a process for the assembly of the package is provided. The package includes a metal or metal alloy base component having an ordered array of holes. Terminal pins are electrically interconnected to a desired circuit and extend through the ordered array of holes. A dielectric polymer sealant bonds a cover component to both the circuit and to the base component. During package assembly, the polymer sealant flows into the holes comprising the ordered array of holes electrically isolating the terminal pins from the base component.

22 Claims, 2 Drawing Sheets

METAL PIN GRID ARRAY PACKAGE

BACKGROUND OF THE INVENTION

While the invention is subject to a wide range of applications, it is particularly suited for metal packages to house an electronic device. In particular, the invention relates to epoxy sealed pin grid array-type packages having a metal or metal alloy base component.

Microelectronic devices are typically manufactured from a semiconductor material, such as silicon, germanium or gallium/arsenide. The semiconductor material is fashioned into a die, a generally rectangular structure having circuitry formed on one surface. Along the periphery of that surface are input/output pads to facilitate electrical interconnection to external components.

The semiconductor device is brittle and requires protection from moisture and mechanical damage. This protection is provided by a package. The package also contains an electrically conductive means to transport electrical signals between the semiconductor device and external circuitry.

One package design which minimizes space requirements and provides a high density of interconnections between the electronic device and external circuitry is the pin grid array package. The conventional pin grid array package comprises a multilayer alumina ($Al_2O_3$) substrate having conductive circuitry disposed between the layers. The circuitry terminates at a plurality of conductive pads to which terminal pins are brazed. The pins are generally configured into a regular array. U.S. Pat. No. 4,821,151 to Pryor et al discloses a ceramic pin grid array package.

Molded plastic pin grid array packages are also known in the art. In one configuration, disclosed in U.S. Pat. No. 4,688,152 to Chia, a printed circuit wiring board having plated through holes serves as the package base. An integrated circuit device is bonded to one face of the printed circuit board. Lead wires electrically interconnect the integrated circuit device to circuit traces on the board. The circuit traces terminate at conductive rings containing terminal pins which pass through the printed wiring board and exit the opposite surface of the board. The surface containing the integrated circuit, wire bond and circuit traces, is then encapsulated in a molding plastic.

Yet another molded plastic pin grid array package is disclosed in U.S. Pat. No. 4,816,426 to Bridges et al. The patent discloses a circuit tape having terminal pins prebonded to the tape. The pins are electrically interconnected to circuit traces formed on the tape. The assembly is then partially encapsulated within a polymer resin.

Ceramic pin grid array packages have excellent reliability, but are brittle, expensive and are poor conductors of heat. One of the chief advantages of a pin grid array package is the high number of electrical interconnections possible. The more complex the integrated circuit, the more heat generated during operation. If this heat is not removed, the device operating life is decreased. It has been estimated that for every 10° C. increase in operating temperature the effective operating life of the device is decreased by 50 percent.

Plastic pin grid array packages are not brittle and considerably cheaper to manufacture than ceramic pin grid array packages. The thermal performance of a plastic pin grid array package may be improved by molding a metal heat spreader into the body of the package as disclosed in the above cited U.S. Pat. No. 4,816,426. While such a package gives exceptional performance, the large surface area of exposed plastic makes plastic pin grid array packages susceptible to moisture permeation.

One way to achieve the hermeticity and reliability of the ceramic package with the reduced cost and improve thermal performance of the plastic pin grid array package is with a metal pin grid array package. A hermetic metal pin grid array package is disclosed in a Toshiba new product release entitled "METAL PIN GRID ARRAY PACKAGE". The publication discloses a printed wiring board circuit containing a plurality of terminal pins. The pins exit the wiring board and pass through a metal base. An isolation seal electrically isolates the terminal pins from the metal package base.

The composition of the isolation seal is not disclosed. It appears to be a cylindrically-shaped apertured preform of a metal sealing glass composition such as a borosilicate. These preforms are widely used to isolate feed through pins from metal package bases in hybrid packaging. Examples of isolation seals are given in U.S. Pat. No. 4,706,382 to Suppinger et al as well as U.S. Pat. No. 4,716,082 to Ahearn et al.

Disadvantages with the use of isolation seals include cost and difficulty of assembly. Preforms, either glass or plastic, are inserted on each terminal pin. Each terminal pin is then aligned within the metal base prior to formation of the isolation seal. If the seal is glass, it must be carefully selected so that its coefficient of thermal expansion of the glass is close (typically within about 10 percent) to the coefficient of thermal expansion of the package base and the terminal pins. Since the glass is inherently brittle, glass fracture and loss of electrical isolation is a potential problem.

SUMMARY OF THE INVENTION

Accordingly, it is an object of the invention to provide a metal pin grid array package having improved thermal performance over both ceramic and plastic packages, while retaining the cost benefits of a molded plastic package. It is a further object of the invention to minimize water permeation by limiting the amount of plastic exposed to the atmosphere. It is an advantage of the invention that feed throughs are not employed for electrical isolation. It is a further advantage of the invention that the metal package components may be easily formed by conventional stamping techniques. It is a feature of the invention that the metal base component may be either copper or aluminum, or alloys of these metals to maximize conduction of heat from the integrated circuit device. It is yet another feature of the invention that metal package components may be coated with another metal or with a refractory oxide layer to maximize adhesion.

Accordingly, there is provided a metal pin grid array package. The package has a cover component and a metal or metal alloy base component. The base component contains an ordered array of holes. A circuit is disposed between the cover component and the base component. A plurality of terminal pins are electrically interconnected to the circuit. The pins extend outwardly through the ordered array of holes in the package base. A dielectric sealing means bonds the cover component to both the circuit and to the base component, as well as the base component to the circuit. The dielectric sealing means further extends into the array of holes to electrically isolate the terminal pins from the metal or metal alloy base component.

The above stated objects, features and advantages of the invention will become more apparent from the specification and Figures which follow:

DESCRIPTION OF THE PREFERRED EMBODIMENTS

Figure 1:
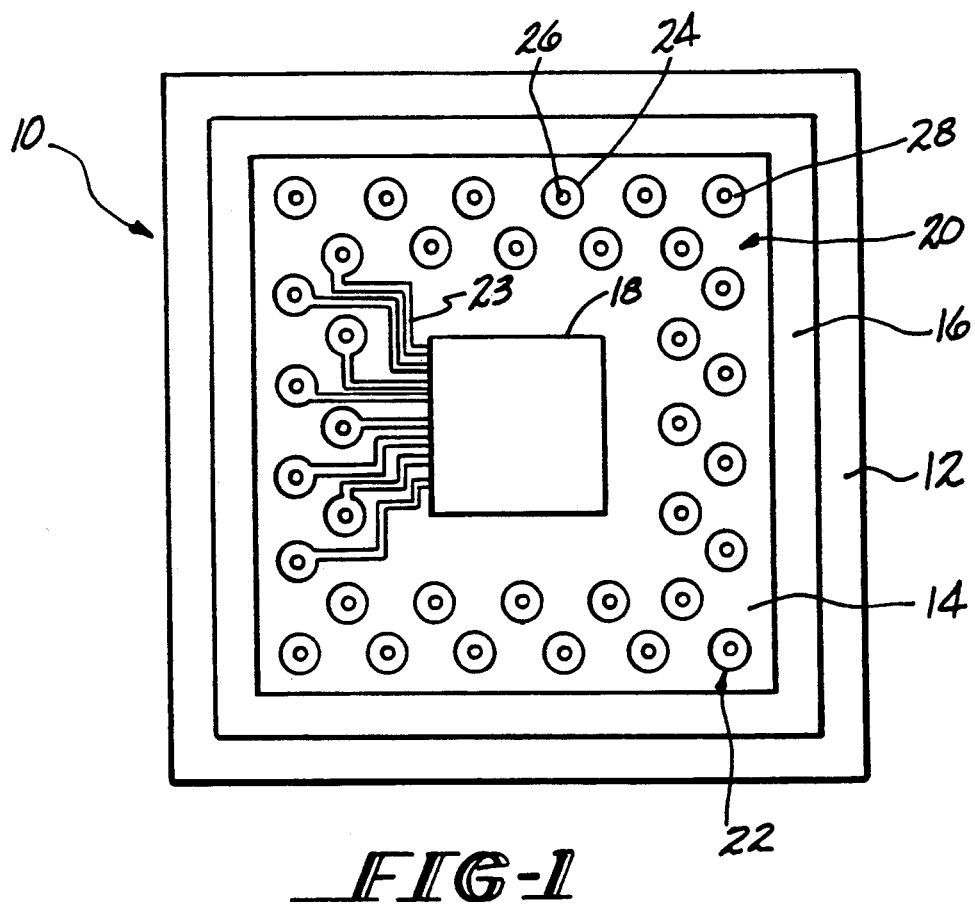
FIG. 1 shows in top planar view the relationship between the package base component of the invention and a circuit.

FIG. 1 shows in top planar view a portion of a pin grid array package 10 in accordance with the invention. The package 10 includes a base component 12 and a circuit 14. A first polymer sealant 16 is disposed between the base component 12 and circuit 14. The peripheral dimension of base component 12, that is the sum of the length and width, is larger than the peripheral dimension of the first polymer sealant 16, which in turn has larger peripheral dimensions than the circuit 14. Although the package components are shown as square and most conventional pin grid array packages have equal lengths and widths, the package 10 may be rectangular or any desired shape in accordance with the invention.

A personality window 18 is formed through both the circuit 14 and the first polymer sealant 16 to permit the integrated circuit device (not shown) to be bonded directly to the base component 12.

The circuit 14 comprises at least one metal layer and preferably, at least one dielectric support layer 20. The dielectric support layer 20 may be any non-conductive medium such as a ceramic, glass or polymer. A polymer support layer may be rigid such as a glass filled epoxy or flexible such as a polyimide. One suitable polyimide is Kapton manufactured by DuPont.

A conductive metal layer 22 is bonded to the dielectric support layer 20 such as by lamination. The conductive metal layer is generally quite thin, on the order of about 0.0007 inches to about 0.0028 inches thick. To insure adequate current carrying capability through the relatively small cross sectional area circuit traces, a metal having high electrical conductivity such as copper or a dilute copper alloy preferably form the conductive layer 22. The conductive layer is formed into a plurality of circuit traces 23 and terminal pin bonding sites 24.

The conductive layer is typically patterned by photolithographic techniques. Briefly, this process entails applying a photosensitive resist over the conductive metal layer 22. A mask defining the desired circuit pattern or its negative image is placed over the resist. A light source exposes those areas not shielded by the mask. The photoresist polymerizes in the exposed areas and becomes resistant to a first solvent. The photoresist which did not polymerize is then removed by dissolution in this first solvent. The exposed metal foil is then etched, using a suitable acid or combination of acids to expose the underlying polyimide layer. After rinsing away the acid, etchant, a second solvent removes by dissolution the polymerized resist. Metal circuit traces 23 in the desired lead pattern remain. The photolithographic techniques may employ either positive or negative photoresists as known in the art.

While FIG. 1 shows circuit traces 23 originating from only a portion of the bonding sites 24 to facilitate drawing clarity, a circuit trace 23 generally originates from each or most bonds sites and terminates at personality window 18. The total number of bonding sites is limited only by the resolution of the photolithographic technique employed and the size of the base component 12 and personality window 18. It is within the scope of the invention for the circuit 14 to include several hundred bonding sites 24.

The terminal pin bonding sites 24 include a metallized region 26 formed in conjunction with the circuit trace 23. An aperture 28 extends through the center of each metallized region and the underlying support layer. The aperture 28 diameter is sized to receive a terminal pin.

Figure 2:
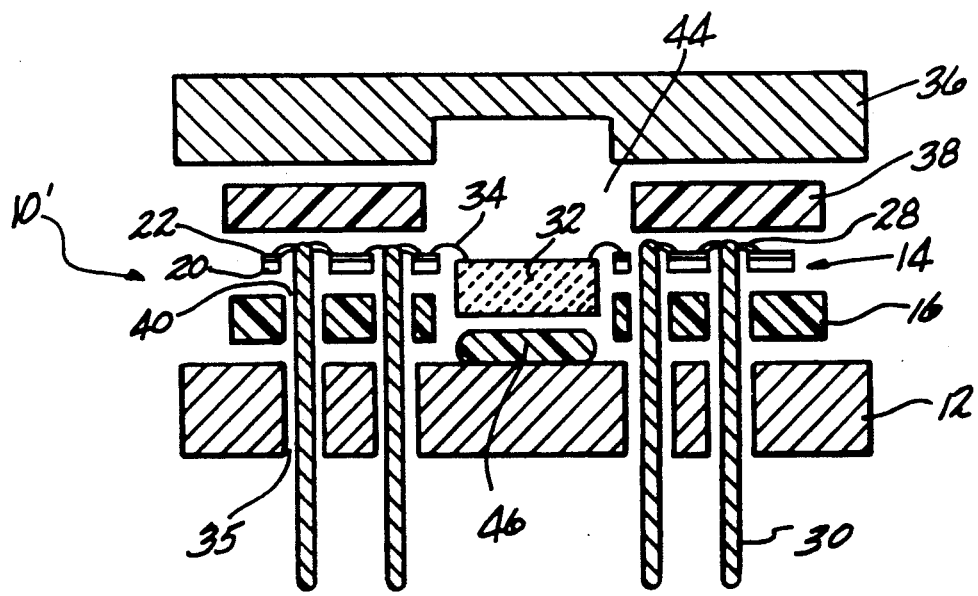
FIG. 2 shows in cross-sectional representation the metal pin grid array package of the invention prior to assembly.

FIG. 2 shows in cross-sectional representation a metal pin grid array package 10' prior to assembly. A terminal pin 30 passes through the circuit 14 by way of aperture 28. The terminal pins 30 are formed from any machinable electrically conductive material. The terminal pins 30 preferably have sufficient tensile strength to resist deformation during repeated insertions and removals. Preferably, the terminal pins are formed from copper or a copper base alloy, such as C510 (also known as phosphor-bronze, having the nominal composition 3.5-4.9% by weight tin, 0.03-03.5% by weight phosphorus, and the balance copper). Alternatively, an iron nickel alloy, such as KOVAR (a trade name for an iron-nickel-cobalt alloy) may be employed. The terminal pins 30 may be coated with another metal to enhance solderability and adhesion as described below.

The terminal pins 30 are electrically interconnected to the bonding sites 24. Electrical interconnection may be by mechanical contact as disclosed in U.S. Pat. No. 4,816,426 cited above, or by a technique such as soldering as disclosed in U.S. patent application Ser. No. 145,977 by Chang et al, filed Feb. 2, 1988. A solder paste is applied to the metallized region 26 of bonding sites 24 by a process such as screen printing. After insertion of the pins, a solder bond is formed by heating the assembly to a temperature sufficient to melt and flow the solder. For example, a solder paste comprising 60 percent by weight lead and 40 percent by weight tin would melt and flow at a temperature of about 250° C.

Any solder having a melting point below about 275° C. and capable of bonding to the metallized regions 26 of bonding sites 24 and to terminal pins 30 is acceptable. The temperature limitation is related to the dielectric support layer 20. At temperatures above about 275° polyimide begins to degrade. Of course, if a more thermally resistant support layer is employed, the maximum temperature and number of suitable solders are both increased.

An integrated circuit device 32 which may be a silicon based semiconductor circuit is electrically interconnected to circuit traces 23. Electrical interconnection may be by bond wires 34. The bond wires 34 are thin, on the order of 0.001 inch in diameter, wires formed from copper, aluminum, gold or alloys thereof. The bond wires are bonded to the integrated circuit device 32 and to the circuit traces 22 by a wire bonding process such as thermosonic or thermocompression bonding.

As an alternative to bond wires 34, foil leads (not shown) formed from the conductive metal layer 22 may extend in cantilever fashion into the personality window 18. The foil leads are then bonded to the input/output pads of the integrated circuit device 32 by thermocompression bonding by the technique known as tape automated bonding (TAB).

The circuit assembly comprising the circuit 14, bonded terminal pins 30 and bonded device 32 is disposed between the base component 12 and a cover component 36. The terminal pins 32 pass through a first array of holes 35 formed in the base component. The base component 12 is formed from a metal or a metal alloy. To maximize the dissipation of heat from the electronic device 32 through the base component 12, the base component is preferably formed from copper, aluminum or alloys thereof. Most preferably, the base component comprises an aluminum base alloy, such as aluminum alloy 3003 (nominal composition 0.05–0.20 weight percent copper, up to 0.6 weight percent silicon, up to 0.7 weight percent iron, up to 0.1 weight percent zinc and the balance aluminum). Aluminum and aluminum base alloys are preferred since they have been found as effective as copper for the dissipation of heat from the electronic device and have a density only 60% that of copper. The thermal performance of an aluminum base alloy package is about equivalent to that of a copper or copper alloy base package and yet weighs only 60% as much. Reduced package weight is desirable in applications such as aerospace and where excess weight is a penalty such as packages subject to rapid acceleration.

The first array of holes 35 has the same configuration as the apertures 28 formed in the circuit 14. The diameters of the holes comprising the first array of holes 35 are sufficiently large that terminal pins 30 pass through the holes without contacting the base component 12.

The array of holes 35 may be formed by any suitable metal removal techniques such as drilling, piercing, stamping or chemical milling. From both a process reproducibility and a process rate standpoint, stamping or piercing are preferred to form the first array of holes 35.

The cover component 36 may be fashioned from any material which bonds to a second polymer sealant 38. The cover component 36 is selected from the group consisting of thermosetting polymers, thermoplastic polymers, ceramics, metals and metal alloys, as well as composite materials, such as cermets and cerglass. The choice of material is dependent upon the application and the desired properties of the metal pin grid array package. A molded plastic cover component 36, such as a pre-molded epoxy cover, provides the advantages of low cost, good adhesion to polymer sealant and light weight. However, moisture permeation is a problem.

A ceramic cover component has the advantages of being lightweight and imparting rigidity to the overall metal pin grid array package. However, most common ceramics such as aluminum oxide ($Al_2O_3$) have a coefficient of thermal expansion of about $4.9 \times 10^{-7}$ in/in/° C. Copper and aluminum have coefficients of thermal expansion in excess of about $170 \times 10^{-7}$ in/in/° C. The mismatch in coefficients of thermal expansion may result in package flexure during thermal cycling severe enough to fracture the electronic device 32.

Most preferably, the cover component 36 is selected to be a metal or metal alloy. The cover component 36 may have the same composition as the base component 12 or a different alloy may be selected. For example, the base component 12 may be selected to be copper or a copper base alloy having high thermal conductivity such as C110 (electrolytic tough pitch copper having the nominal composition 99.90% by weight copper and a maximum oxygen concentration of 0.05%). The cover component 36 may be selected to be high strength copper alloy such as C724 (nominal composition 84.3% by weight copper, 13.0% nickel, 2.0% aluminum, 0.5% manganese and 0.2% magnesium). Thermal conduction is maximized through the dilute copper base alloy. The high yield strength alloy forming the cover contributes rigidity of the metal pin grid array package 10'. To minimize package weight both the base and cover components may be an aluminum base alloy.

A dielectric sealing means is provided as first 16 and second 38 polymer sealant layers. The dielectric property of the sealant maintains electrical isolation between the terminal pins 30, the conductive metal layer 22, the base component 12 and the cover component 36. The first 16 and second 38 polymer sealant layers may be provided as discrete sheets of an adhesive or in paste or liquid form and deposited by a process such as screen printing.

The dielectric sealant is selected to be a polymer adhesive which cures at a temperature below about 275° C. to prevent thermal degradation of the dielectric support layer 20. The polymer sealant is selected to be what is known in the art as "semiconductor grade". Semiconductor grade adhesives release lower amounts of ionic contaminants during the cure reaction than standard adhesives. Ionic contaminants are undesirable. They may deposit on the bond wires 34 or metallized surfaces of the electronic device 32 leading to corrosion and device failure.

The dielectric sealant is preferably selected to be a thermosetting polymer resin such as an epoxy. One suitable epoxy is Ablestik 550 is manufactured by Ablestik Labs, Gardenia, Calif. The adhesive cures and provides sufficient flow when heated to a temperature of from about 125° C. to about 175° C. and a pressure of from about 0.5 psi to about 1.5 psi. pressure may be applied through the use of a clamp.

The second adhesive layer 38 has essentially the same peripheral dimension as the first adhesive layer 16. The second polymer sealant layer 38 is larger than the circuit 14 and smaller than the base component 12 or cover component 36.

The first polymer adhesive layer 16 is disposed between base component 12 and circuit 14. The first polymer sealant layer 16 is provided with a second array of holes 40 corresponding to the first array of holes 35. The diameter of the holes making up this second array of holes 40 is slightly larger than the diameter of terminal pins 30. To minimize the required volume of sealant, the diameter of the second array of holes 40 is less than about 0.010 inches larger than the diameter of the terminal pins 30. More preferably, the diameter of the second array of holes 40 is from about 0.001 to about 0.005 inches larger than the diameter of the terminal pins 30.

The diameter of the first array of holes 35 is on the order of about 0.005 to 0.020 inches larger than the diameter of the terminal pins 30. More preferably, the diameter of the holes comprising the first array of holes is from about 0.010 inches to about 0.015 inches larger than the diameter of the terminal pins 30. The terminal pins 30 extend through the first 35 and second 40 arrays of holes. Electrical isolation between the metal or metal alloy base component 12 and the terminal pins 30 is provided by the first polymer adhesive 16 which flows into the first array of holes 35. In one embodiment of the invention a refractory oxide layer is formed within the first array of holes 35. The refractory oxide also contributes to terminal pin isolation.

The second polymer adhesive layer 38 is disposed between the cover component and the circuit 14. An aperture 44 is preferably provided in the second polymer sealant layer 38 so adhesive does not flow over the bond wires 34 or the integrated circuit device 32. Other techniques to control polymer flow such as dams may also be employed.

A die attach material 46 is disposed between the integrated circuit 32 and package base 12. While the electronic device 32 may be free floating and supported solely by the bond wires 34 the use of a die attach provides an improved thermal conduction path. The die attach material 46 may be any thermally conductive material which bonds to the backside of the integrated circuit device 32 and package base 12. The die attach material 46 should have a melting or cure temperature approximately equal to the cure temperature of the dielectric sealant. Suitable die attach materials include low melting solders such as 60% lead/40% tin, or preferably, a polymer adhesive filled with a thermally conductive material. One such adhesive is a silver filled epoxy known as Ablefilms manufactured by Ablestik Labs.

Figure 3:
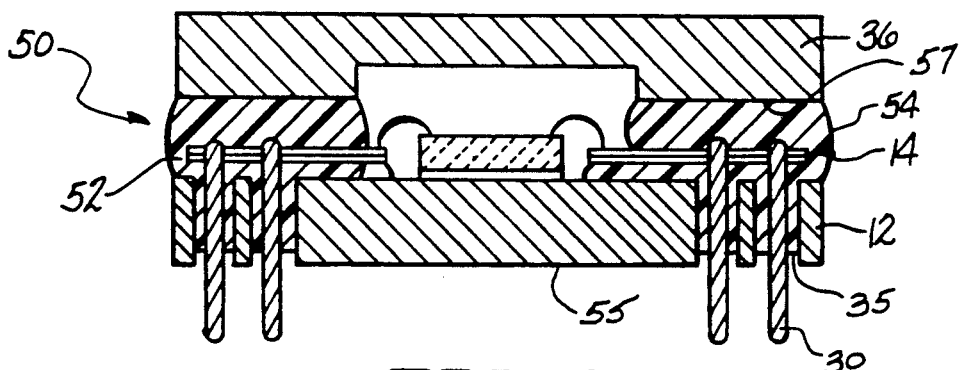
FIG. 3 shows in cross-sectional representation a metal pin grid array package in accordance with the invention.

The package 10' of FIG. 2 is bonded to complete assembly of the metal pin grid array package 50 of FIG. 3. The application of heat and pressure causes first 16 and second 38 polymer adhesive layers to flow. The layers fuse to form a continuous dielectric layer 52. Since the peripheral dimension of first 16 and second 38 polymer sealant layers is larger than the peripheral dimension of flexible circuit 14 following the cure cycle the dielectric sealing means 52 extends beyond the edges of the circuit 14 to form a continuous surface 54.

A major source of moisture penetration into an electronic package is along plastic/metal interfaces. Elimination of the circuit 14 with metal circuit traces 23 from the edges of the package 50 reduces the possibility of moisture penetration. The dielectric sealing means 52 bonds the cover component 36 to both the circuit 14 and to the base component 12.

The base component 12 is bonded to the circuit 14. During the cure cycle, the dielectric sealing means 52 flows into the first array of holes 35 in the base component 12. The polymer sealant 54 effectively centers the interconnect pins 30 within each hole comprising the array.

The dielectric sealant 52 further electrically isolates the terminal pins 30 from the metal or metal alloy base component 12. To prevent electrical leakage through the dielectric sealant 52, the resistivity of the dielectric within the first array of holes 35 must be sufficiently high. Resistivity is defined as the electric resistance offered by a material to the flow of current. It is a function of the cross sectional area of the current flow and the unit length of current path. Resistance to current leakage within the first array of holes 35 is a function of the dielectric sealant 52 as well as the separation distance between the terminal pin 30 and the base component 12. For a typical epoxy adhesive having a dielectric constant of about 4, a separation of about 0.01 inches will provide for electrical resistivity of greater than about $10^{10}$ ohms which is sufficient to prevent current leakage.

By regulating cure cycle time, pressure and temperature, the depth of dielectric sealant 52 penetration within the first array of holes 35 is controlled. Preferably the cure cycle is selected so that the dielectric sealant does not flow beyond the bottom edge 55 of the base component 12. The excess flow of sealant and the resulting formation of a flash along the terminal pins 30 may interfere with the proper electrical functioning of the pins.

To improve the bond between dielectric sealant 54 and the metal components of the pin grid array package 50, it is preferable to provide a surface coating 57 on the metal components or at least those surfaces of the components in contact with the dielectric sealant. The surface coating may be formed in situ. An in situ coating is formed from the metal alloy itself. Certain copper or copper base alloys such as C638 (2.5–3.1 weight percent aluminum, 1.5–2.1 weight percent silicon, 0.25–0.55 weight percent cobalt and the balance copper) are capable of forming an in situ refractory oxide layer substantially $Al_2O_3$. The refractory oxide layer is typically formed by placing the copper base alloy in a container having an atmosphere of 4% hydrogen, 96% nitrogen and a trace of water. The gas is heated to a temperature of between about 330° C. and about 820° C. Depending on the temperature dwell time, a refractory oxide layer of a desired thickness is formed on the surface of the alloy. Formation of such a refractory oxide is disclosed in U.S. Pat. No. 4,461,924 to Butt et al. which is incorporated herein by reference.

The coating layer may be formed by depositing a second material on the metal components. For copper and copper base alloys a coating layer of a second metal such as nickel is preferred. As disclosed in U.S. Pat. No. 4,888,449 by Crane et al, electrolytically deposited dull nickel plate on copper or copper base alloy substrates provides exceptional adhesion to an epoxy adhesive. Other suitable coating materials include chromium, iron and their alloys.

Most preferred for the package base 12 and cover 36 components are aluminum alloys coated with a hydrated aluminum oxide. The coating is applied by anodization. As disclosed in U.S. Pat. No. 4,939,316 by Mahulikar et al., 1988 an anodized aluminum surface provides exceptional adhesion between the epoxy sealant and the anodized surface. Further, the anodized aluminum package substrate has been found to have thermal dissipation capabilities about equal to that of copper or a copper based alloy.

Figure 4:
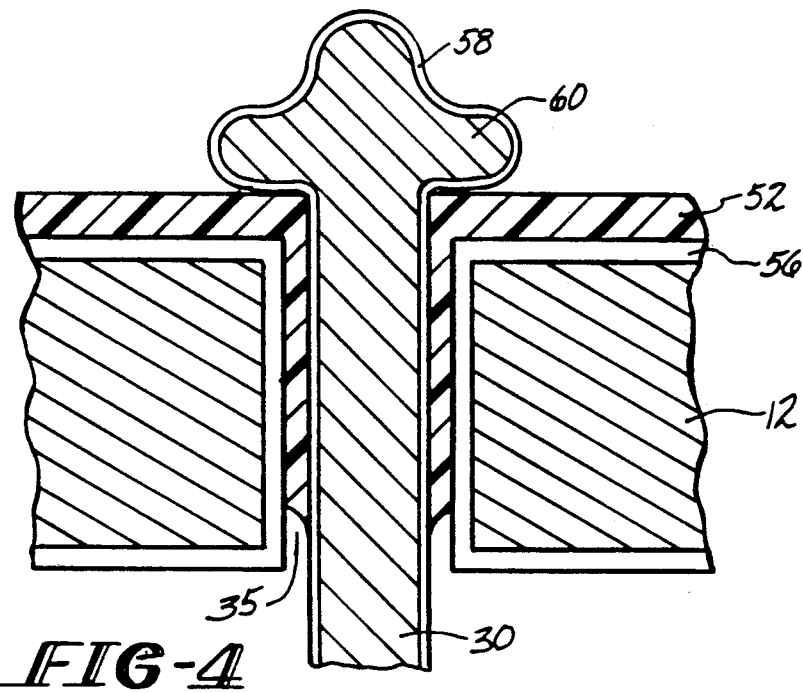
FIG. 4 shows in cross-sectional representation a means for electrically isolating the terminal pins in accordance with one embodiment of the invention.

In an embodiment of the invention illustrated in FIG. 4, the package substrate 12 comprises an aluminum or aluminum base alloy. An anodization layer 56 is applied to all surfaces of the package base 12. While this embodiment discloses all aluminum alloy surfaces coated with the anodization layer 56 only those surfaces exposed the external environment need be covered with the anodization layer to prevent salt spray induced corrosion. Preferably, those surfaces in contact with the polymer adhesive 52 are also anodized to improve adhesion to the substrate. The thickness of the anodized coating layer 56 is typically on the order of from about 20 microinches to about 2 mils. More preferably, thickness is from about 1 mil to about 2 mils.

The resistance of an anodized aluminum surface is greater than about $10^{10}$ ohms. An anodization layer on the walls of the holes contributes to the electrical isolation of terminal pins 30. However, the bulk of the electrical isolation is still provided by the dielectric sealant 52. Therefore, the diameter of the holes comprising the first array of holes 35 is essentially the same whether or not an anodization layer 56 is applied.

The terminal pins 30 may also contain a coating layer 58 to improve adhesion. The coating 58 is preferably a metal coating layer. While a refractory oxide layer also enhances adhesion, this type of coating is less preferred due to increased resistivity. Preferably the terminal pins 30 are coated with a second metal such as nickel or gold.

A shoulder 60 may be provided on the terminal pins 30. The diameter of the shoulder 60 exceeds the diameter of the holes within the first array of holes 35. The shoulder 60 prevents the pins from pulling loose from the adhesive 52 during insertion or withdrawal. The yield strength of the metal base component 12 is much higher than the yield strength of conventional molding resins so the terminal pins of the package of the invention are significantly less likely to pull loose from the package than the terminal pins of a molded plastic package.

Figure 5:
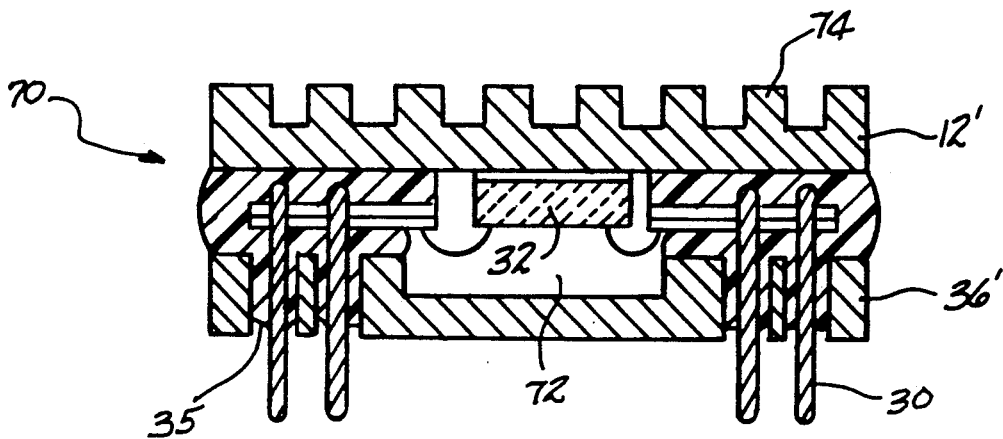
FIG. 5 shows in cross-sectional representation a metal pin grid array package in accordance with a second embodiment of the invention.

Another metal pin gird array package of the invention is illustrated in cross-sectional representation in FIG. 5. The first array of holes 35 is formed in the cover component 36' rather than the base component. When the terminal pins 30 are inserted into external circuitry, the cavity 72 housing the electronic device 32 faces downward. The package 70 is of the type known in the art as a "cavity down" package.

The metal base 12' of the metal pin grid array package 70 may be formed with a series of fins 74 to maximize the transfer of heat from the base 12' to the surrounding environment. Unlike ceramic or plastic pin grid array package bases, the metal base 12' of the invention may be readily machined to include a plurality of fins 74 or any other desired shape.

While the invention has been particularly described in terms of pin grid array type packages, it is equally applicable to other types of metal packages which employ through pins, for example, hybrid microelectronic packages.

While the in grid array packages of the invention have been described in terms of a cover component bonded to a base component, it is within the scope of the invention to bond a seal ring to the base component and to bond the cover component to the seal ring at a later time. This type of assembly is known as a "window frame" package.

The patents, publications and patent applications set forth in the specification are intended to be incorporated by reference herein.

It is apparent that there has been provided in accordance with this invention a metal pin grid array package which fully satisfies the objects, means and advantages set forth herein before. While the invention has been described in combination with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

I claim:

1. A metal pin grid array package, comprising: a cover component;
   a metallic base component having a first array of holes;
   a circuit disposed between said cover component and said base component;
   a plurality of terminal pins electrically interconnected to said circuit and extending through said first array of holes;
   a dielectric sealing means for bonding said cover component to both said circuit and to said base component and said base component to said circuit; and
   said dielectric sealing means extending into said first array of holes electrically isolating said plurality of terminal pins from said base component.

2. The package of claim 1 wherein said base component is selected from the group consisting of copper, aluminum and alloys thereof.

3. The package of claim 2 wherein the diameter of said holes comprising said first array of holes is from about 0.005 to about 0.020 inches larger than the diameter of said terminal pins.

4. The package of claim 3 wherein diameter of said holes comprising said first array of holes is from about 0.010 to about 0.015 inches larger than the diameter of said terminal pins.

5. The package of claim 3 wherein the dielectric sealing means is a polymer adhesive providing an electrical resistance effective to electrically isolate said terminal pins from said base component.

6. The package of claim 5 wherein said polymer adhesive provides a resistivity in excess of about $10^{10}$ ohms.

7. The package of claim 6 wherein said polymer adhesive is selected to be a thermosetting epoxy.

8. The package of claim 6 wherein said base component is formed from an aluminum alloy with those surfaces exposed to the external environment anodized.

9. The package of claim 8 wherein the walls of said holes are anodized.

10. The package of claim 9 wherein said cover component is formed from an aluminum alloy with those surfaces exposed to the external environment anodized.

11. The package of claim 6 wherein said base component is selected to be copper or a copper base alloy.

12. The package of 11 wherein said base component is a copper alloy capable of forming an in situ refractory oxide layer, said refractory oxide layer formed on those surfaces in contact with the polymer adhesive.

13. The package of claim 11 wherein said copper or copper alloy base component is coated with a second metal or metal alloy on at least those surfaces in contact with the dielectric sealing means, said coating layer selected from the group consisting of nickel, chromium, iron and their alloys.

14. The package of claim 11 wherein said cover component is selected to be copper or a copper alloy.

15. The package of claim 14 wherein said cover component is selected to be a copper alloy having relatively high tensile strength and said base component is selected to be a copper alloy having relatively high thermal conductivity.

16. The package of claim 14 wherein the portion of said cover component in contact with said polymer adhesive is coated with a second metal or a metal alloy selected from the group consisting of nickel, chromium, iron and their alloys.

17. A metal pin grid array package, comprising:
a cover component having a first array of holes;
a metallic base component;
a circuit disposed between said cover component and said base component;
a plurality of terminal pins electrically interconnected to said circuit and extending through said first array of holes;
a dielectric sealing means for bonding said cover component to both said circuit and to said base component and said base component to said circuit; and
said dielectric sealing means further extending into said first array of holes electrically isolating said plurality of terminal pins from said cover component.

18. The package of claim 17 wherein the diameter of said first array of holes is from about 0.005 inches to about 0.020 inches larger than the diameter of said terminal pins.

19. The package of claim 17 wherein said dielectric sealing means is selected to be a thermosetting epoxy providing a resistivity in excess of about $10^{10}$ ohms.

20. The package of claim 18 wherein said cover component is an aluminum alloy with those surfaces exposed to the external environment and the walls of the holes anodized.

21. The package of claim 20 wherein said base component is an aluminum alloy.

22. The package of claim 20 wherein those surfaces of said base component exposed to the external environment are anodized.

* * * * *